(12) United States Patent
Elsherbini et al.

(10) Patent No.: US 10,476,545 B2
(45) Date of Patent: Nov. 12, 2019

(54) COMMUNICATION BETWEEN INTEGRATED CIRCUIT PACKAGES USING A MILLIMETER-WAVE WIRELESS RADIO FABRIC

(71) Applicant: Intel Corporation, Santa Clara, CA (US)

(72) Inventors: Adel A. Elsherbini, Chandler, AZ (US); Telesphor Kamgaing, Chandler, AZ (US); Sasha N. Oster, Chandler, AZ (US); Brandon M. Rawlings, Chandler, AZ (US); Georgios C. Dogiamis, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/745,980

(22) PCT Filed: Sep. 25, 2015

(86) PCT No.: PCT/US2015/052472
§ 371 (c)(1),
(2) Date: Jan. 18, 2018

(87) PCT Pub. No.: WO2017/052651
PCT Pub. Date: Mar. 30, 2017

(65) Prior Publication Data
US 2018/0234128 A1    Aug. 16, 2018

(51) Int. Cl.
*H04B 1/40* (2015.01)
*H04B 1/00* (2006.01)
(Continued)

(52) U.S. Cl.
CPC ............. *H04B 1/40* (2013.01); *H01L 24/00* (2013.01); *H01L 25/00* (2013.01); *H04B 1/00* (2013.01);
(Continued)

(58) Field of Classification Search
CPC .......... H01L 2224/16225; H01L 24/00; H01L 25/00; H01L 2924/15311; H04B 1/005; H04B 1/40; H04B 1/00
See application file for complete search history.

(56) References Cited

U.S. PATENT DOCUMENTS 7,330,702 B2 *  2/2008  Chen ....................... H04B 1/38
                                                                   257/725
7,617,342 B2 * 11/2009  Rofougaran ......... H01Q 1/2275
                                                                   235/492
(Continued)

FOREIGN PATENT DOCUMENTS

KR    10-2013-0074585    7/2013

OTHER PUBLICATIONS

International Search Report and Written Opinion for International Patent Application No. PCT/US2015/052472 dated, Jun. 24, 2016, 13 pgs.
(Continued)

*Primary Examiner* — Devan A Sandiford
(74) *Attorney, Agent, or Firm* — Schwabe, Williamson & Wyatt P.C.

(57) ABSTRACT

Communication is described between integrated circuit packages using a millimeter-wave wireless radio fabric. In one example a first package has a radio transceiver to communicate with a radio transceiver of a second package. The second package has a radio transceiver to communicate with the radio transceiver of the first package. A switch communicates with the first package and the second package
(Continued)

to establish a connection through the respective radio transceivers between the first package and the second package. A system board carries the first package, the second package, and the switch.

20 Claims, 8 Drawing Sheets

(51) Int. Cl.
   *H01L 25/00* (2006.01)
   *H01L 23/00* (2006.01)
(52) U.S. Cl.
   CPC .... *H04B 1/005* (2013.01); *H01L 2224/16225* (2013.01); *H01L 2924/15311* (2013.01)

(56) References Cited

U.S. PATENT DOCUMENTS

| | | | | |
|---|---|---|---|---|
| 7,750,435 B2* | 7/2010 | Rofougaran | ............ | H01L 23/48 257/531 |
| 8,630,209 B2* | 1/2014 | Mihota | ............ | H04B 3/52 348/207.99 |
| 2002/0046324 A1* | 4/2002 | Barroso | ............ | G06F 12/0826 711/122 |
| 2002/0075883 A1* | 6/2002 | Dell | ............ | H04L 49/1576 370/413 |
| 2002/0085578 A1* | 7/2002 | Dell | ............ | H04Q 11/0478 370/422 |
| 2002/0152060 A1* | 10/2002 | Tseng | ............ | G06F 13/22 703/17 |
| 2003/0108031 A1* | 6/2003 | Inden | ............ | H04L 12/4625 370/352 |
| 2004/0176129 A1 | 9/2004 | Menon et al. | | |
| 2004/0210800 A1* | 10/2004 | Ghislain Gabriel Vecoven | .......... | G06F 11/0712 714/4.2 |
| 2004/0221198 A1* | 11/2004 | Vecoven | ............ | G06F 11/0727 714/25 |
| 2005/0107102 A1* | 5/2005 | Yoon | ............ | H04W 74/00 455/466 |
| 2006/0004837 A1* | 1/2006 | Genovker | ............ | H04L 45/28 |
| 2006/0101185 A1* | 5/2006 | Kapoor | ............ | G06F 13/4022 710/308 |
| 2007/0066220 A1 | 3/2007 | Proctor, Jr. et al. | | |
| 2007/0103878 A1* | 5/2007 | Ohmori | ............ | G02B 6/43 361/760 |
| 2007/0207831 A1 | 9/2007 | Tinsley et al. | | |
| 2007/0229270 A1* | 10/2007 | Rofougaran | ............ | G06K 7/0008 340/572.1 |
| 2009/0008753 A1* | 1/2009 | Rofougaran | ............ | H04L 12/40013 257/660 |
| 2009/0106576 A1* | 4/2009 | Jacobowitz | ............ | G06F 1/324 713/501 |
| 2009/0239483 A1* | 9/2009 | Rofougaran | ............ | H04L 12/40013 455/90.2 |
| 2011/0095385 A1* | 4/2011 | Kawamura | ............ | H01L 23/48 257/428 |
| 2011/0173336 A1* | 7/2011 | Xie | ............ | H04L 45/02 709/228 |
| 2011/0182218 A1* | 7/2011 | Rofougaran | ............ | H04B 7/10 370/310 |
| 2011/0183617 A1* | 7/2011 | Behzad | ............ | H04L 12/4011 455/41.2 |
| 2011/0199972 A1* | 8/2011 | Warke | ............ | H01Q 3/26 370/328 |
| 2013/0149957 A1 | 6/2013 | Desclos et al. | | |
| 2014/0181469 A1* | 6/2014 | Wilson | ............ | G06F 15/17362 712/29 |
| 2018/0067881 A1* | 3/2018 | Frandzel | ............ | G06F 13/1642 |
| 2018/0212306 A1* | 7/2018 | Elsherbini | ............ | H01Q 9/0457 |
| 2018/0227963 A1* | 8/2018 | Kamgaing | ............ | H05K 7/1487 |
| 2018/0316375 A1* | 11/2018 | Kamgaing | ............ | G06F 1/16 |

OTHER PUBLICATIONS

International Preliminary Report on Patentability for International Patent Application No. PCT/US2015/052472, dated Apr. 5, 2018, 10 pages.

* cited by examiner

COMMUNICATION BETWEEN INTEGRATED CIRCUIT PACKAGES USING A MILLIMETER-WAVE WIRELESS RADIO FABRIC

CROSS-REFERENCE TO RELATED APPLICATION

This patent application is a U.S. National Phase Application under 35 U.S.C. § 371 of International Application No. PCT/US2015/052472, filed Sep. 25, 2015, entitled "COMMUNICATION BETWEEN INTEGRATED CIRCUIT PACKAGES USING A MILLIMETER-WAVE WIRELESS RADIO FABRIC," which designates the United States of America, the entire disclosure of which is hereby incorporated by reference in its entirety and for all purposes.

FIELD

The present description pertains to communication between integrated circuit packages and, in particular, to communication using a wireless radio fabric.

BACKGROUND

In multiple CPU servers, multiple CPU high performance computers and other multiple chip systems, direct communication between different CPUs can greatly enhance the overall system performance. Direct communication reduces the communication overhead and the latency. This is particularly true for usage scenarios in which the data is written to shared memory pools. Direct communication may be achieved by adding a switch or a switch matrix on the system board that carries the CPU's. The connections to the switch can be made through the system board. This requires that the data is carried through the socket pins, for socketed CPUs. The number of socket connections is limited by the size of the socket. The data rate is also limited by the materials and interfaces between the CPU, the socket, and the system board. The connections to the switch may also be made using flex top side connectors. These connectors connect one chip to another directly with a dedicated cable avoiding the socket and the system board. Top side connectors provide higher data rates, but are more expensive. In addition, the package is more complex and assembly of the packages into a system is more complex because the cables must be placed and connected after all of the chips are in place.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
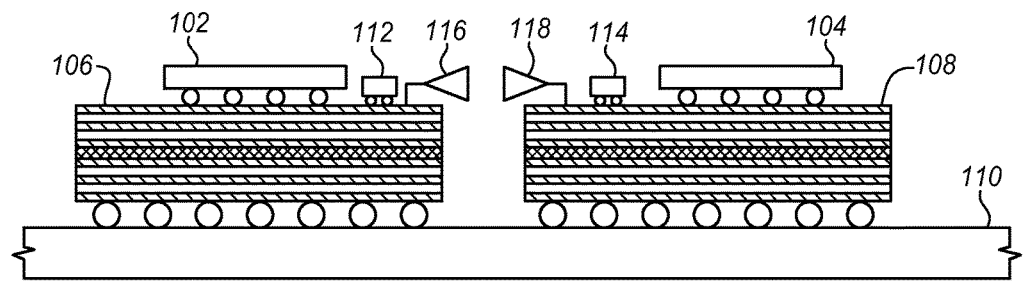
FIG. 1 is a side view cross-sectional diagram of a wireless interconnect for chip-to-chip communications according to an embodiment.

Wireless interconnects are used as described herein between the CPUs, between the CPU and a switch, and between the CPUs and other chips. The switch may demodulate and downconvert all the wireless signals and then retransmit them. Alternatively, the switch may use direct passband or passive switching, such as free space reflectors, lenses, and wave guides. Reflectors and other passives may even be attached to the system board or to a case or other housing. With millimeter waves, the propagation is very similar to that of optical propagation with well-defined propagation paths between the nodes. The waves are highly directional but not as sensitive to alignment as is the case with free space optics. In addition millimeter wave carriers are able to provide very high data rates, such as 160 Gbps or more, with less power consumption than laser diodes.

Copper traces through sockets and system boards are limited by the available space and routing layers. The copper traces are not ideal signal carriers and the many interfaces from pin to via to layer cause noise and interference. Millimeter-wave wireless transceivers can be implemented using standard CMOS (Complementary Metal Oxide Semiconductor) processes and require very little space on a large CPU or chipset package. The space required is less than that required for optical and flexible (aka flex) cable connectors. Even when active repeaters are used very little space is required for a demodulator, re-modulator and amplifier system for short distances in millimeter wave.

The assembly of multiple packages in a single system is easier than with cable and optic fiber because the radio signal can cross each other without coupling and interfering. This makes it much simpler to create mesh networks. In addition to the wave beams being crossed, they may also be steered. If the packages are placed appropriately, each CPU can communicate with any other CPU using the same set of antennas by steering the millimeter wave beams with a phased array or other device. Steering or directed antennas also allow for communication with packages that are out of the plane of the transceiver. Communication may be directed in any of three dimensions so that, for example a CPU on a motherboard may communicate with a storage blade above the motherboard or even with external devices which are sufficiently close by.

Two main components may be used for many of the described implementations. Wireless millimeter wave nodes on at least two CPUs or other packages and a wireless switch. The millimeter wave nodes have an millimeter wave radio die and an antenna. The millimeter wave radio die can be part of a CPU package in the same or a different die from the CPU. The radio may also be in a separate package with a connection to the CPU or other die. The nodes can be dedicated to a CPU, memory, nonvolatile storage, chipset or any other desired high speed die or device. The nodes do not have to be on the same motherboard as the switch or as each other. One of the two nodes may be on a different motherboard or on a chassis component. One advantage of the wireless communications and the switch is that there may also be many more than two nodes.

In the present discussion, the nodes are described and discussed as mounted to CPU packages with a high power CPU, but any other type of package may be used. The implementations described herein are able to take advantage of one or more of the special features that may be implemented in an millimeter wave fabric network.

The described embodiments may include reconfigurability. Each node can steer the beam to any other neighboring node. A millimeter wave beam may be steered using multiple antennas and controlling their phase or by using multiple antennas or antenna arrays with a control switch. In mesh networks where multiple transceivers exist on a single package, the multiple antennas can be used in at least two different ways. First, more than one transceiver may be used to support a single channel so that the aggregated channels carry double or higher data rates between two CPUs. This provides flexibility when the CPUs are able to use more bandwidth than a single channel can provide. Second different transceivers may be used to communicate each with a different CPU. Alternatively, a single transceiver with a switchable beam direction may be constructed on each package that each allows point to point communication with a different CPU.

The described embodiments may benefit from simple routing. Each node can act as a simple router or as a repeater to connect two CPUs that do not have a line of sight connection. Each node can also act to double the data rate between two or more CPUs. Changes in routing can be configured using control signals which can have a low data rate. The control signals can be sent through a special wireless channel or even through the system board and any package and socket interfaces between the two nodes.

FIG. 1 is a general side view cross-sectional diagram of one example of a wireless interconnect using antennas for chip to chip communication or for free space optics. A first 102 and second 104 chip are each mounted to a respective package 106, 108 using a ball grid array (BGA), land grid array (LGA), or other connection system including pads, wire leads, or other connectors. The packages are mounted to a printed circuit board (PCB) 110, such as a motherboard, system or logic board or daughter card using a solder ball array or any other desired system. The packages 106, 108 are electrically connected to external components, power, and any other desired devices through traces (not shown) on or in the PCB. The chips may also be connected to each other through the PCB. The packages may be mounted to the PCB using sockets (not shown), depending on the particular implementation.

The first and second chip 102, 104 are discussed herein as being central processing units and, in particular, as server CPUs. However, the techniques and configurations described herein may be applied to many different types of chips for which a high speed communications link would be suitable. In some implementations, the chip may include many different functions such as with a SoC (System on a Chip). In other implementations, the chips may be memory, a communications interface hub, a storage device, co-processor or any other desired type of chip. In addition, the two chips may be different so that one may be a CPU and the other may be a memory or a chipset, for example.

Each chip is also connected through the package to a respective radio 112, 114. The radio may be formed of a single die or a package with multiple dies or using another technique. Each radio is mounted to the package near the edge of the package that is near to the other chip. The package may include copper traces, lines, or layers to connect particular lands, pads, or solder balls of the chip to the radio die for data and control signals. The radio die may also be connected to the chip to provide power to the radio die. Alternatively, the radio die may obtain power from an external source through the package connection to the PCB.

An antenna 116, 118 is also mounted to the package and coupled to the radio. Extremely small antennas may be used that are integrated onto or into the package substrate. The antennas are configured so that when the packages are mounted to the PCB, the antennas are directed to each other. The short distance between the antennas allow for a low power and low noise connection between the two chips. The wireless interconnect reduces the complexity of the socket and the complexity of the motherboard for the computing platform.

While different frequencies may be used to suit particular implementations. Millimeter wave and sub-THz frequencies allow for an antenna that is small enough to be integrated on the same package that is normally used for the chip. The antennas may also be constructed using the same materials that are used in the fabrication of the package substrate and still exhibit good electrical performance.

In some embodiments, a server may be constructed with multiple CPUs. Each CPU may be mounted to a package with multiple parallel radio die and antenna sets to provide multiple parallel channels within the server between two CPUs. A small antenna size permitted for millimeter-wave signals allows each antenna of the package for one of the CPUs to be directed to a corresponding antenna on the package for the other CPU. This configuration may be used to combine parallel radio connections and provide Terabit per second data rates.

In some embodiments, a broadband wireless interconnect may be used. For example with a radio operating in a radio frequency range of from 100-140 GHz, the size of each antenna including the keep out zone can be as small as 1.25×1.25 mm to 2.5×2.5 mm. The actual antenna may be still smaller. Considering a typical server CPU package, more than 30 antennas of 1.25×1.25 mm may be placed along one edge of the package. This would allow more than 30 separate links each carrying 40-80 Gb/s each over a short distance. The separate links may all be used to communicate with a single second chip as shown in FIG. 1 or there may be different package antennas placed next to different antennas of the CPU package. This allows the CPU package to communicate with different chips using different links.

In addition to the simple point-to-point connection of FIG. 1, point-to-multi-point transmission may also be provided without using an external switch matrix. The antennas of multiple chip packages may be positioned within range of the antenna or antennas of one of the CPU packages. The multiple chip packages may all receive the same signal from the CPU package at the same time. In order to control which of the multiple chip package receive a transmission, the radio and antenna system may include beam steering.

Figure 2:
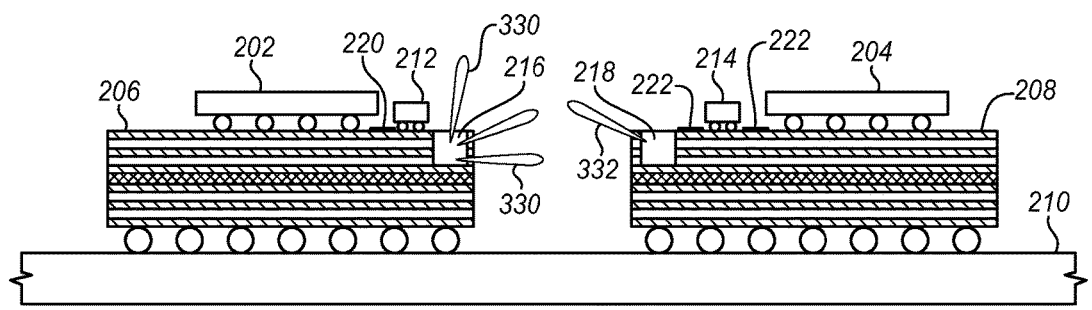
FIG. 2 is a side view cross-sectional diagram of an alternative wireless interconnect for chip-to-chip communications according to an embodiment.

FIG. 2 is a side view cross-sectional diagram of an alternative configuration of a wireless interconnect. As shown a first 202 and a second 204 chip are mounted to respective package substrates 206, 208 which are each mounted to a motherboard 210. Each chip is connected to a respective radio die 212, 214 through its respective package 206, 208. Each radio die 212, 214 is connected to a respective antenna 216, 218. The antennas are positioned to provide a clear and direct wireless connection.

The packaged system may take any of a variety of different forms. One or both of the packages may be a microelectronic module that contains a system on a chip (SoC) or CPU die 202, 204, a millimeter-wave or sub-THz transceiver chip (radio) 212, 214 and an on-package integrated antenna 216, 218. Additional dies and other supporting components such as passives and connectors may also be assembled on the package substrate 206, 208. A SoC die is typically designed and implemented on a low resistivity digital silicon and may also include typical functions found in the baseband portion of a wireless module. If the transceiver or radio die is implemented as a separate die, as shown, then it may be implemented in a high resistivity silicon or on any other type of RF semiconductor substrate including Gallium Arsenide, Gallium Nitride and certain polymers. Alternatively, the radio 212 may be implemented on the primary die 202. A low loss package material processed to have low surface roughness may be used for the package 206 to provide superior electrical performance in the millimeter-wave and sub-THz frequency range. The package materials may include liquid crystal polymers and its derivatives, prepreg (pre-impregnated fiberglass resin and epoxy), BT (bismaleimide triazine resin epoxy) laminates, other organic substrates, glass, silicon or ceramic.

The wireless interconnect system includes the transceiver chip 206, the on-package antenna 216, 218 and on-package routing 220, 222 to connect the transceiver chip to the main chip and to the antenna. The wireless transmission also uses a wireless receiver on the other package. The receiver system may be a mirror image of the transmitter. For bidirectional transmission, the millimeter-wave/sub-THz transceiver may have both transmit and receive chains.

Figure 3:
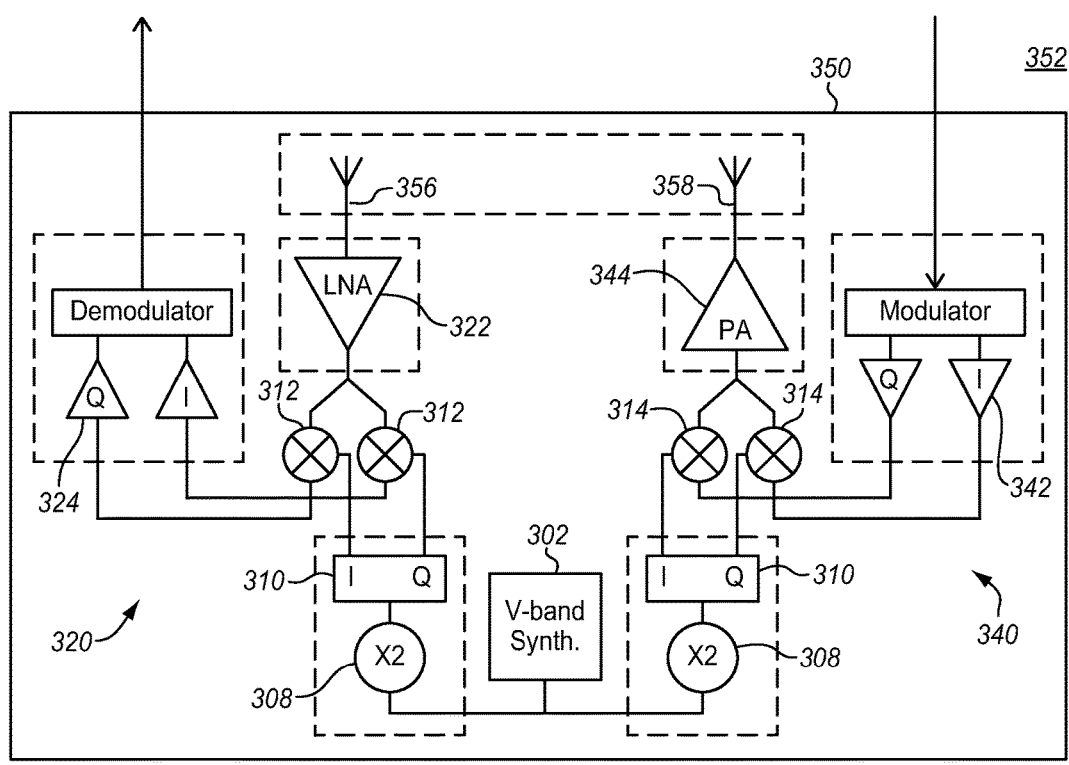
FIG. 3 is a block diagram of a radio chip and related components according to an embodiment.

FIG. 3 is a block diagram of an example of a transceiver or radio chip system architecture and connected components that may be used for the wireless interconnect described herein. The transceiver chip may take a variety of other forms and may include additional functions, depending on the particular implementation. This radio design is provided only as an example. The radio chip 350 is mounted to the package substrate 352 to which the primary integrated circuit die or chip 202, 203 is also mounted as shown in FIG. 1. The substrate 352 is mounted to the PCB or motherboard. The radio package may include a local oscillator (LO) 302 or a connection to an external LO and optionally a switch that allows the external LO feed to be used instead of or in addition to the internal LO. The LO signal may pass an amplifier and multiplier, such as an active doubler 308 and 0/90° quadrature hybrids 310 to drive an upconverter and mixers 314.

The RX (receive) chain 320 may contain a receive antenna 356 in the package coupled to a low noise amplifier (LNA) 322 and a wideband baseband (BB) amplification chain 324 with downconverters 312 for analog to digital conversion. The TX (transmit) chain 340 may include a BB digital driver chain 342 to the upconverters 314, and a power amplifier (PA) 344 to the transmit antenna 358. There may be multiple transmit and receive chains to transmit and receive over multiple channels simultaneously. The various channels may be combined or consolidated in different ways, depending on the particular implementation.

The TX and RX chains are both coupled through the substrate to the antenna. There may be a single antenna for TX and RX or there may be separate RX and TX antennas as shown. The antennas may be designed to have different radiation patterns to suit different wireless connections. In the example of FIG. 2, the first chip's antenna 216 has a wide beam transmit and receive pattern 330. This may allow the chip to communicate with multiple antennas in different locations on the motherboard. The second chip's antenna 218, on the other hand has a narrow beam transmit and receive pattern 332. This allows power to be concentrated in a single direction for communication with just one other device.

Figure 4:
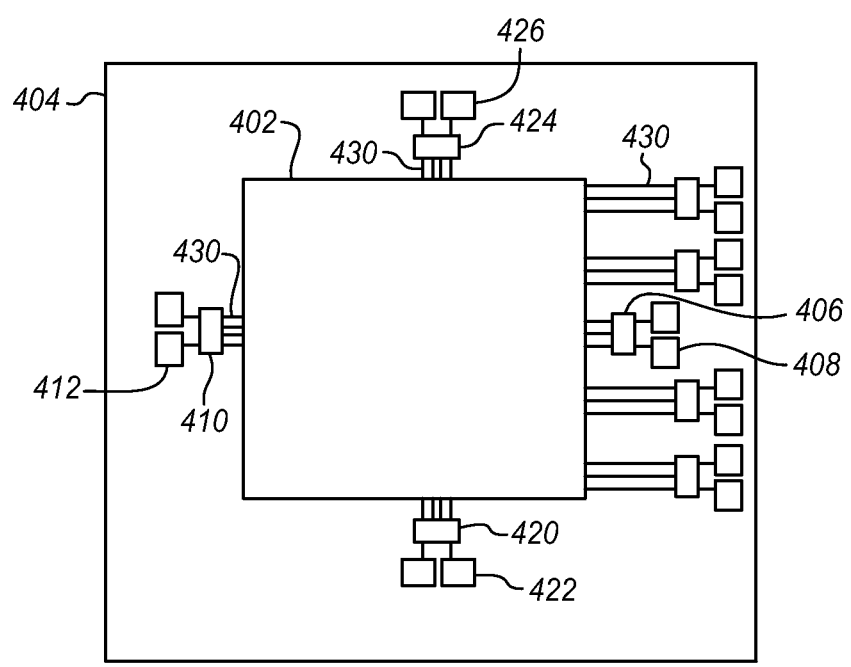
FIG. 4 is a top view diagram of a package with multiple wireless interconnects for chip-to-chip communications according to an embodiment.

FIG. 4 is a top view diagram of an example of an implementation of multiple wireless interconnects on a single microserver package. In this example, separate antennas are used to transmit and receive, but it is also possible to share the antenna between the Tx and the Rx chains. The antenna size may vary from 1.25×1.25 mm or less to 2.5×2.5 mm or more depending on the carrier frequency, desired gain, and transmission range.

A single integrated circuit chip or die 402 includes both processing and baseband systems and is mounted to a package 404. The baseband sections of the chip are coupled through on package traces 430 to radio chips or dies which are in turn coupled through the package to antennas. In this example, the die integrated circuit chip is a CPU for a microserver and is rectangular. There are radio chips on each of the four sides of the CPU. The sides shown as top, left, and bottom in the drawing figure each have a respective radio 424, 410, 420 coupled to a respective Tx, Rx antenna pair 426, 412, 422. The side shown as the right side shows five radios each connected to a respective antenna pair. The number of radios and antennas on each side may be determined based on communication rate needs in each direction.

Very few high speed links may be required on a microserver package. A single link is able to deliver data rates in excess of 40 Gb/s across a distance of a few cm. The data rate may still be on the order of 5-10 Gb/s for transmission distances of up to 50 cm.

FIG. 4 shows many wireless links implemented on the same side of one package. This allows the aggregate data rate to be increased. Alternatively, the data may be sent to different other devices that are in the same general direction. Both the radio chips and the antennas are placed towards the edge of the package to limit obstructions in the radio path that may come from heat sinks and heat spreaders. In general the losses for a copper trace baseband signal are much lower than the losses through the same copper trace for an RF signal. As a result, the radio chips may be kept very close to the antenna. This limits electrical signal and power losses due to the RF routing through the substrate. The radio chip may be installed onto the package in any manner desired and may even be embedded in or a part of the substrate. By using multiple radios, the on-package millimeter-wave wireless interconnects can be scaled for extremely high data rate applications. This may be useful in systems such as servers and media recording, processing, and editing systems. As shown, multiple links can be put together to achieve data-rates close to a Tb/s.

Figure 5:
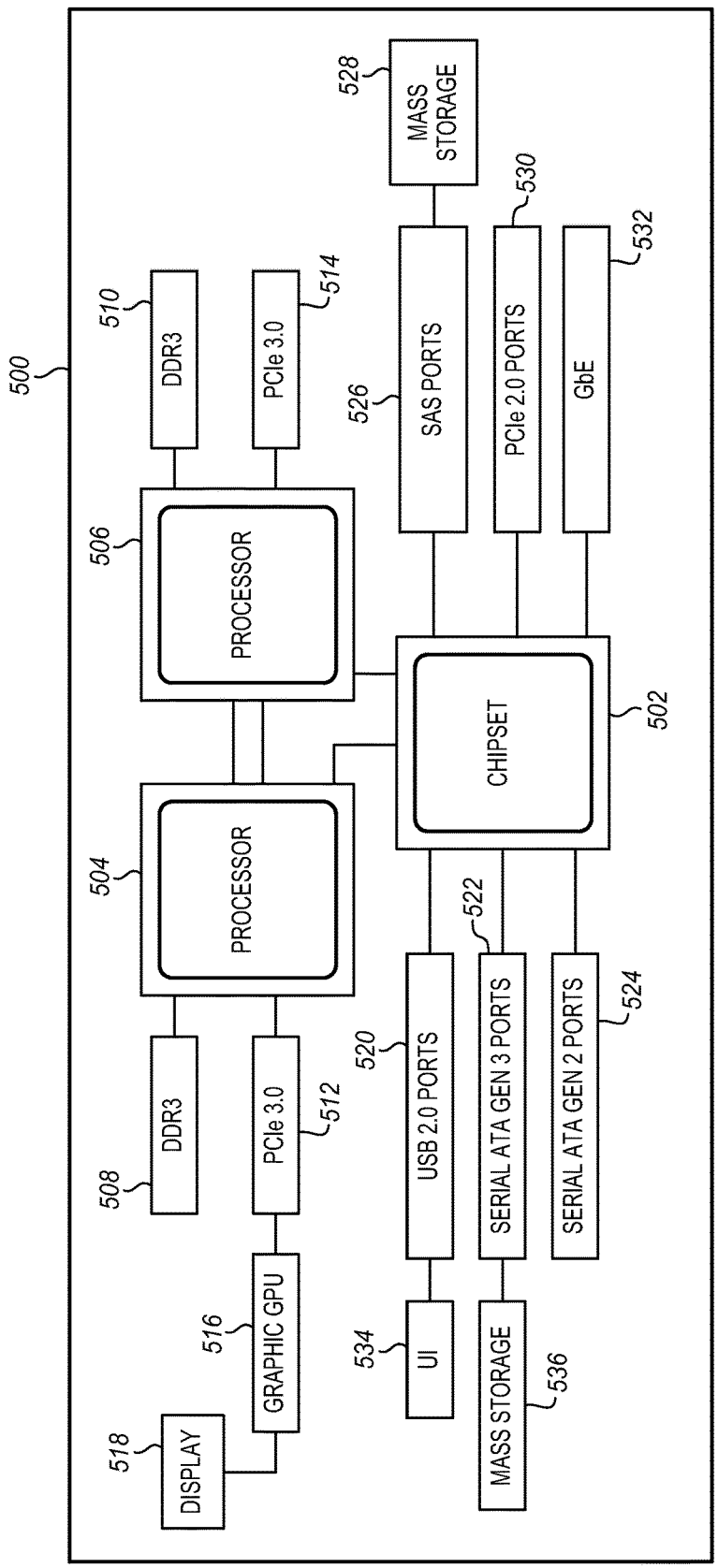
FIG. 5 is block diagram of a computing system with multiple high speed interfaces according to an embodiment.

FIG. 5 is a block diagram of a computing system 500 with multiple high speed interfaces that may be implemented using the wireless connections as described herein. The computing system may be implemented as a server, microserver, workstation, or other computing device. The system has two processors 504, 506 having multiple processing cores although more processors may be used, depending on the particular implementation. The processors are coupled together through a suitable interconnect such as the wireless interconnect described herein. The processors are each coupled to a respective DRAM (Dynamic Random Access Memory) module 508, 510 using a suitable connection, such as the wireless connection described herein. The processors are also each coupled to a PCI (Peripheral Component Interconnect) interface 512, 514. This connection may also be wired or wireless.

The PCI interfaces allow for connections to a variety of high speed additional components such as graphics processors 516 and other high speed I/O systems for display, storage and I/O. The graphics processor drives a display 518. Alternatively, the graphics processor is core or a die within one or both of the processors. The graphics processor may also be coupled to a different interface through a chipset.

The processors are also both coupled to a chipset 502 which provides a single point of contact for many other interfaces and connections. The connection to the chipset may also be wired or wireless, one or both of the processors may be connected to the chipset, depending on the implementation. As shown, a processor 504 may have a wireless connection to one or more processors 506, memory 508, peripheral components 512, and a chipset 502. These connections may all be wireless as suggested by the multiple radio and antennas of FIG. 4. Alternatively, some of these connections may be wired. The processor may have multiple wireless links to the other processor. Similarly the chipset 502 may have wireless connections to one or more of the processors as well as to the various peripheral interfaces as shown.

The chipset is coupled to USB (Universal Serial Bus) interface 520 which may provide ports for connections to a variety of other devices including a user interface 534. The chipset may be connected to SATA (Serial Advanced Technology Attachment) interfaces 522, 524 which may provide ports for mass storage 536 or other devices. The chipset may be connected to other high speed interfaces such as a SAS (Serial Attached Small computer serial interface) interface 526 with ports for additional mass storage 528, additional PCI interfaces 530 and communications interfaces 532, such as Ethernet, or any other desired wired or wireless interface. The described components are all mounted to one or more boards and cards to provide the described connections.

Figure 6:
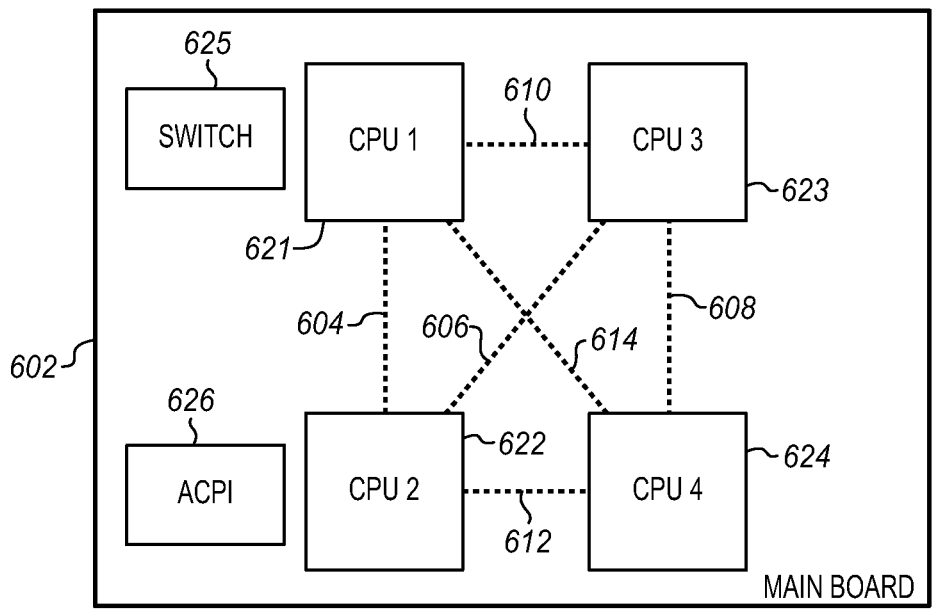
FIG. 6 is a diagram a fabric network with wireless CPU connections according to an embodiment.

FIG. 6 is a diagram of an example of a fabric network for a four CPU system. A system board 602 carries four CPU packages 621, 622, 623, 624. The system board may also carry many other components as in FIG. 5 (not shown). The CPU packages each carry at least three radio transceivers, one for each of the other three CPU packages. Accordingly the first package 621 can establish a wireless link 604, 610, 614 with the second 622, third 623, and fourth 624 packages. The second package 622 can establish a wireless link 604, 606, 612 with the first 621, third 623, and fourth 624 packages. The third package 623 can establish a wireless link 610, 606, 608 with the first 621, second 622, and fourth 624 package. The fourth package is similarly linked to each of the other three packages.

These links are fixed and allow each CPU to communicate with each other CPU. Each link may be independently powered on or off using a wired link through the system board or using a variety of low data rate control channel techniques.

A switch 625 is also coupled to the system board to control the powering on or off of the wireless links. The switch is coupled to each of the four CPUs through the system board and controls the communication links. When a CPU has a data stream to send to another CPU, the switch is able to receive a request from the CPU. The request may be a push or a ping on a shared bus or it may be the setting of a line to a high or low value. The switch then sends a command to the other CPU to activate its radio transceiver that corresponds to the requesting CPU. In this way, the switch activates the wireless data link. If there are multiple links between two CPUs then the switch may determine how many of the links to establish.

The switch may also deactivate any one or more of the links independently of each other link. The CPUs may request that a link be torn down or the switch may detect that the link has been inactive for some period of time and therefore request that the radio transceivers be powered down. By turning off the transceivers when possible, the system may reduce power consumption, heat dissipation and radio interference within the system chassis.

In another example, the switch is coupled to an ACPI (Advance Configuration and Power Interface) component chip on the system board. This component determines and control power consumption for each of the CPUs as well as clock rates. When a CPU enters a low power mode then the switch can determine this from the ACPI component and command that radio transceivers be deactivated. Similarly, when a CPU is switched to an active or high speed state the radio transceivers of that CPU and those that connect to that CPU may be activated.

Figure 7:
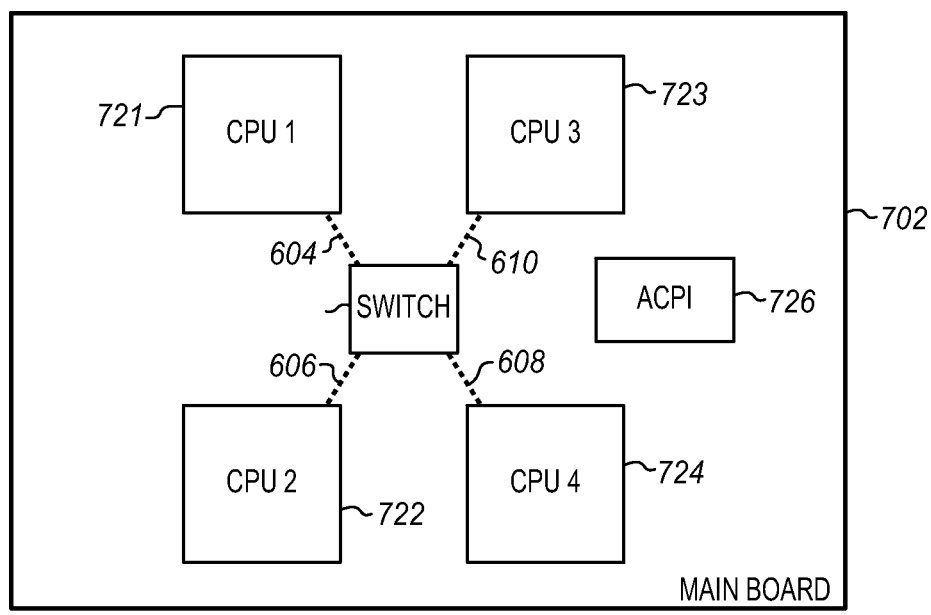
FIG. 7 is a diagram a fabric network with wireless CPU connections through a switch according to an embodiment.

FIG. 7 is a diagram of an example of a fabric network for a four CPU system in which the CPUs communicate through the switch. There are four CPUs 721, 722, 723, 724 each coupled to a system board 702. A switch 725 is coupled to the system board between the CPUs. There is also optionally an ACPI component 726 coupled to the motherboard.

In this example, the CPUs each connect only with the switch. Each CPU has a single wireless connection 604, 606, 608, 610 with the switch. The switch not only manages the wireless links with each CPU but also acts as a relay or repeater. The switch routes the data stream received from each source CPU to the intended other destination CPU using the corresponding link and an appropriate assigned path. The switch may employ passive switching using passive waveguide network, active reflectors or other techniques. Alternatively, the switch may be an active repeater capable of buffering the data streams, remodulating, amplifying any other desired functions.

The switch may also manage power and active states of the wireless links using a connection to each CPU. This connection may be through the system bus or through the radio link. Any of the techniques described above may be used, depending on the particular implementation. The switch may also receive status and activity information from the ACPI. In contrast to the embodiment of FIG. 6, in this embodiment, the switch is able to determine which ones of the CPU transceivers are transmitting. This information may also be used to determine whether radio links are to be activated or deactivated.

The configuration of the single central switch 725 provides additional flexibility if there are multiple wireless links from the switch to each CPU. This allows the switch to then dedicate each link to a different CPU or to aggregate the links so that higher data rates are provided between one pair of CPUs. The switch may be made to determine suitable data rates and channel allocations for each CPU.

Figure 8:
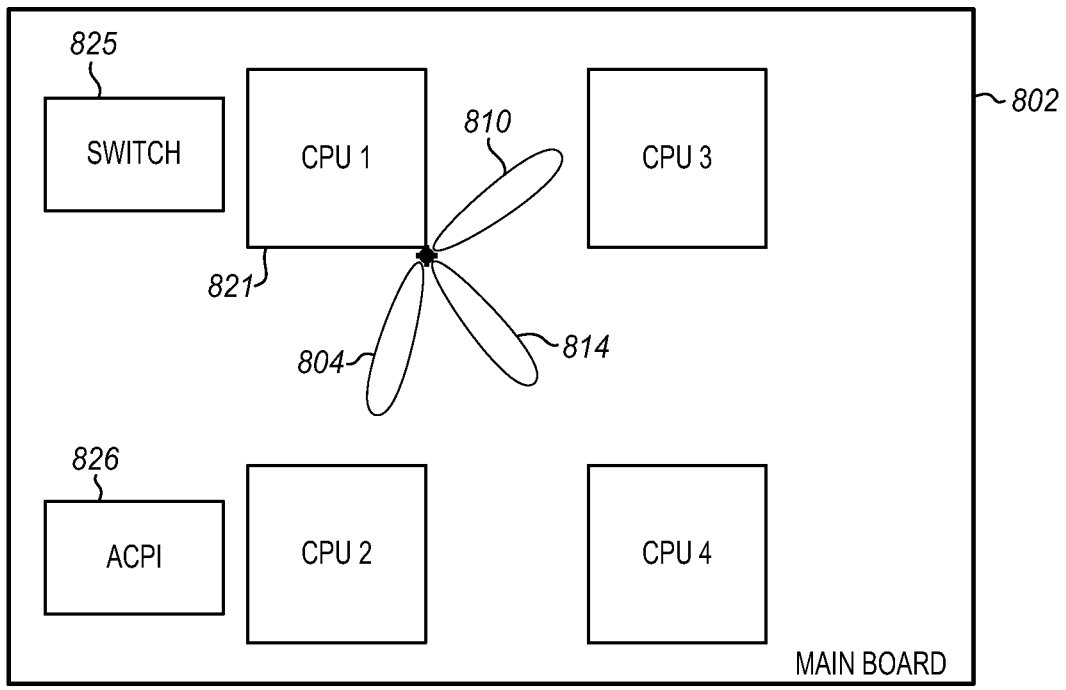
FIG. 8 is a diagram a fabric network with wireless CPU connections through steerable radio beams according to an embodiment.

FIG. 8 is a diagram of an example of a fabric network for a four CPU system in which the CPUs use beam steering.

Only one steered beam is shown in order not to obscure the drawing. Each CPU, as shown for the first CPU 821, has a steerable radio beam, such as a millimeter wave radio transceiver in a phased array or a mechanically operable antenna array. The system includes the four CPUs, although there may be more or fewer, the switch 825 and the ACPI component 826 all mounted to the system board 802. All of the components may be configured to communicate with each other through the system board directly or through another component. Alternatively, there may be another connection that does not require the system board. The system will also include additional component and interfaces (not shown).

Each CPU has a steerable beam antenna and is positioned so that it is able to communicate with each other CPU with direct line of sight radio connection. As examples, the first CPU 821 is able to steer the beam in a first direction 804 to connect with the second CPU, in a second direction 810 to connect with the third CPU and in a third direction 814 to connect to the fourth CPU. These different beam directions allow for a direct wireless send and receive function to and from each other CPU.

The steerable beam function may also be used to allow the communications resources to be reconfigurable. With additional radios, the first CPU may be able to re-direct a steerable beam from one of the CPUs to another. In this way, if there are, for example three steerable beams, the CPU may direct each one to a different one of the other CPUs. Alternatively, the CPU may direct two beams to one of the CPUs and the third to another one or all three beams to one of the CPUs. The data rate from one CPU to another may be doubled or tripled by adding one or two more beams to a communication link between two CPUs. The steerable beams provide flexibility not possible with fixed wired or optical resources so that radio and antenna resources may be redirected to support different links based on the traffic demand. All of this configuration as well as activating and de-activating different links may be controlled by the switch 825 or by the CPUs directly.

Figure 9:
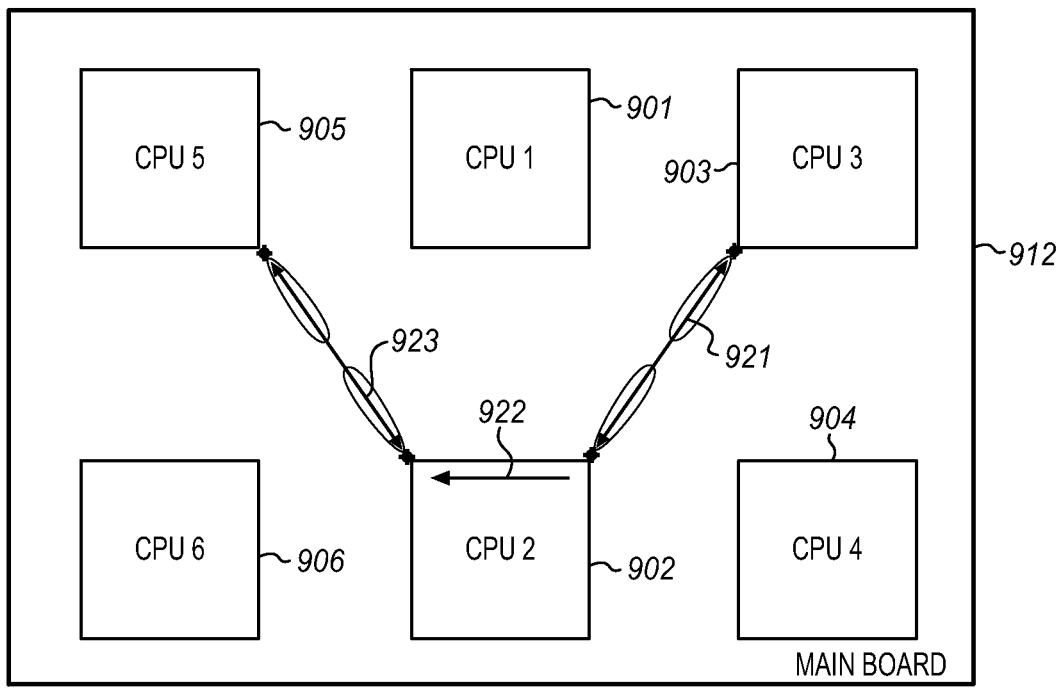
FIG. 9 is a diagram a fabric network with wireless CPU connections through repeater links according to an embodiment.

FIG. 9 is a diagram of a more complex CPU architecture with six CPUs, 901, 902, 903, 904, 905, and 906 all coupled to a common system board 912. There may also be a switch, ACPI, chipset, input output hubs, and other components (not shown) to provide additional functions and external communication. This example is provided to show additional communication links that may be provided if the CPUs cannot communicate by direct line of sight. It is possible to arrange almost any number of CPUs with direct line of sight. For example, these six CPUs may each be positioned at a corner of a hexagon with or without the switch in the center. In this way the system may operate similar to the examples of FIGS. 6 and 7. A ring configuration may provide for simple and direct connections, however, for other reasons, it may be preferred that at least some of the chips be positioned behind the others as shown in FIG. 9.

In the example of FIG. 9, the third CPU 903 does not have a direct line of sight for radio communication with the fifth 905 and sixth 906 CPUs. It does have a direct line of sight to the first 901, second 902, and fourth 904 CPUs, as in the examples of FIGS. 6 and 7. In order to allow communication from one side of the CPU grouping to the other, the radio communications may be routed through any intermediate CPUs. In this case, the third CPU establishes a link 921 to the second CPU. The second CPU establishes a link 923 to the fifth CPU. The second CPU then acts as a repeater transferring the data through a channel 922 in the second CPU. The channel may be a direct communications between radios on one side of the CPU package to the other side. It may also be a connection to a communications portion of the CPU die and out to the radio section on the other side of the package. As mentioned above, the repeater may be passive or active and may demodulate and re-modulate the signal or simply carry it unchanged from one side of the package to the other.

Figure 10:
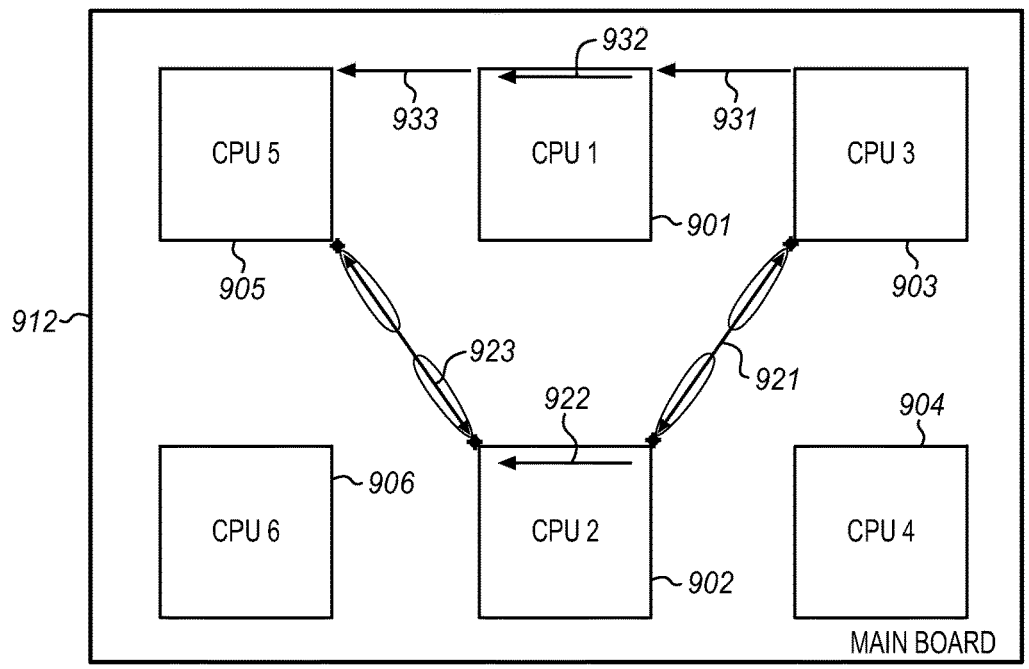
FIG. 10 is a diagram a fabric network with wireless CPU connections through multiple indirect links according to an embodiment.

FIG. 10 is a diagram of the same system as in FIG. 10. In this example a second link has been established between the third and fifth CPU. The connection through the second CPU has been maintained and an additional connection through the first CPU has been established. With the two connections, the data rate may be doubled or substantially increased. The two connections may have different channel capacities, data rates and differences in other characteristics. There is a first link 931 between the third and first CPU and a second link 933 between the first and fifth CPU. An intermediate link 932 through the first CPU establishes the first CPU's function as a repeater. This link 932 may be the same as or different from the repeater link 922 of the second CPU discussed above.

Figure 11:
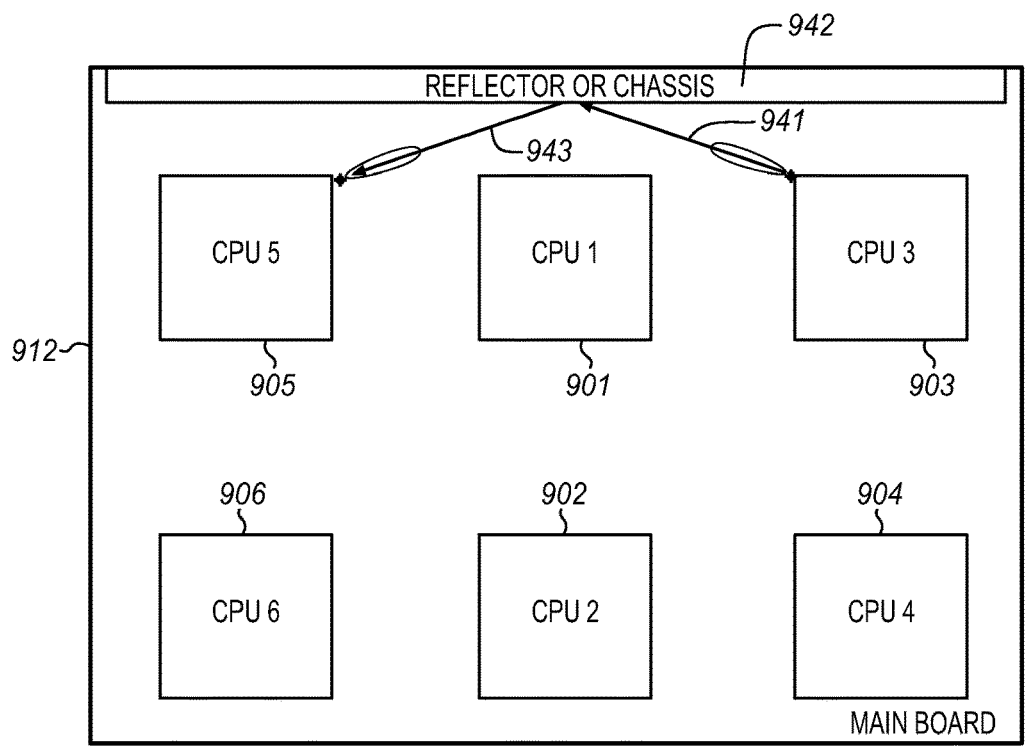
FIG. 11 is a diagram a fabric network with wireless CPU connections through a reflector according to an embodiment.

FIG. 11 shows another alternative for point to point communication for non-line-of-sight communication. In this example, radio wave reflectors 942 are used on the main system board (e.g. on the side of the chassis) in a case or housing. The reflector guides the signals on a path around the obstruction of the first CPU allowing direct communication between the third and fifth CPUs. Accordingly, the third CPU establishes a direct link to the fifth CPU. The diagram shows a first part 931 of the radio propagation path from the third CPU to the reflector 942 and a second part 943 of the propagation path from the reflector to the fifth CPU. This path may be used in addition to and instead of the other two paths 921, 922, 923, 931, 932, 933. All three paths may be aggregated for a higher data rate or fewer may be used when a lower data rate is sufficient.

The two, four, and six CPU systems are provided only as examples. There may be more CPUs and an even or odd number of CPUs. There may also be other packages and components that may provide additional nodes to the fabric network or obstacles to communication. As shown the nodes may communicate through direct line of sight with fixed or steerable reconfigurable radio wave beams. For obstructed paths where there is not line of sight, the nodes may communicate through other nodes as repeaters or through radio reflectors and waveguide to move the data signal around the obstructions. The repeaters may be fully functional nodes such as the packaged CPUs shown or the repeaters may be other components provided specifically as repeaters in the system.

The multiple paths may be configured so that the connection paths can be reconfigured. This allows some communication links to be de-activated and used to establish redundant links to other nodes. The links may then be aggregated to increase data rates and shut down to reduce power consumption.

A switch node may be provided in one of the CPU packages or as a separate component. The switch node may add additional capabilities to the system. It may have multiple antennas to enable many simultaneous channels with a single CPU. The switch node may perform the switching through a wired connection, through a special control channel, or in the passband at millimeter wave. Using the passband reduces the power consumption required by the modulators, demodulators and RF (radio frequency) amplifiers. Such a system may be implemented in a manner similar to a full optical network switching system.

The radio communication links described herein may be combined with other technologies, such as optical connections, flex cable connections, and system board connections. As an example, millimeter wave channels may be used for communication between different CPUs and optical modulators and demodulators or flex cables may be used for communications with components that are in a different chassis or housing.

Figure 12:
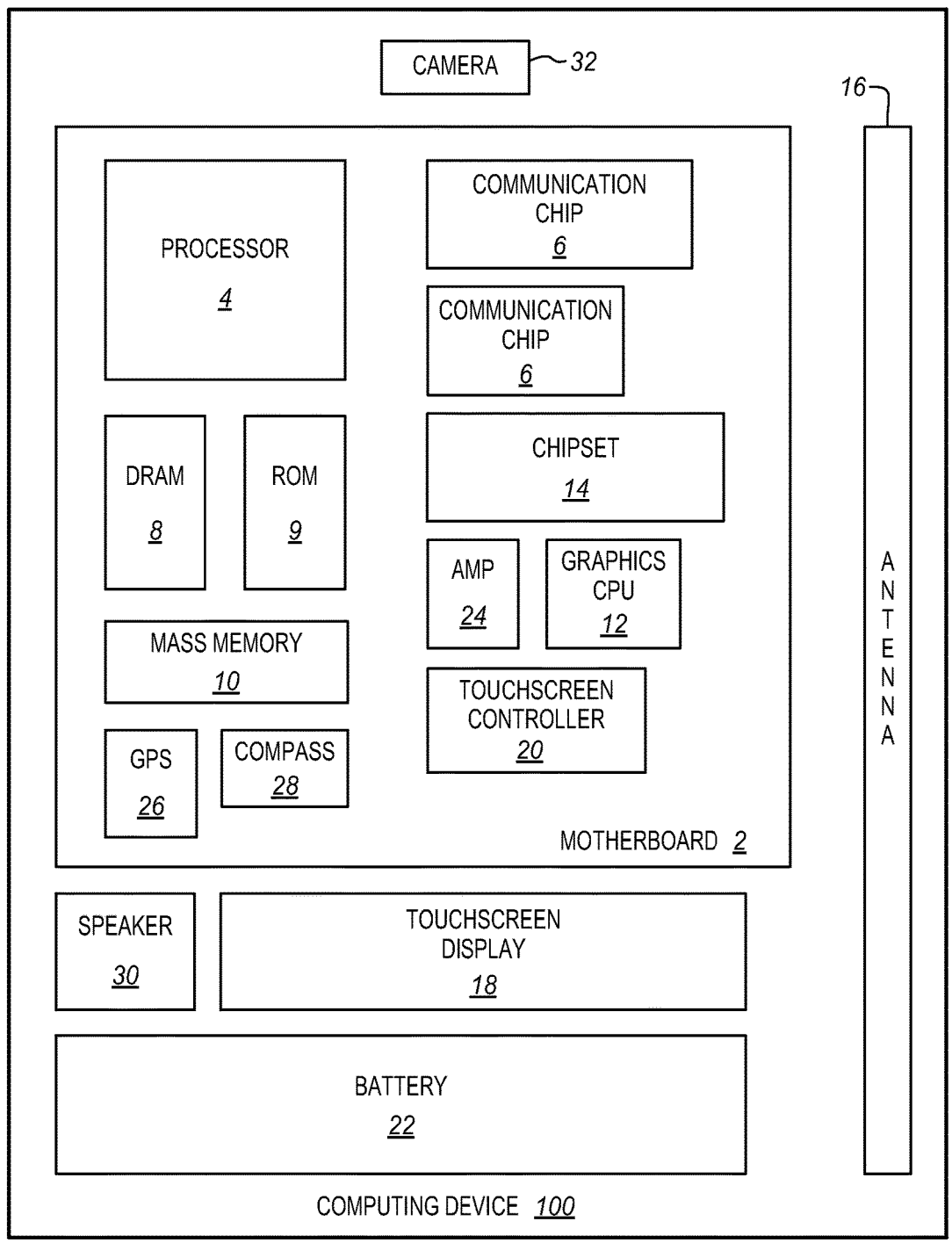
FIG. 12 is a block diagram of a computing device incorporating wireless interfaces according to an embodiment.

FIG. 12 illustrates a computing device 100 in accordance with another implementation. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, any one or more of the components may be adapted to use the wireless connection described herein. The features of the system of FIG. 12 may be adapted to that of FIG. 7 and vice versa. For example, the system of FIG. 12 may carry multiple processors. The system of FIG. 7 may include any one or more of the peripherals shown in FIG. 12. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a first package having a radio transceiver to communicate with a radio transceiver of a second package, the second package having a radio transceiver to communicate with the radio transceiver of the first package, a switch to communicate with the first package and the second package and to establish a connection through the respective radio transceivers between the first package and the second package, and a system board to carry the first package, the second package, and the switch.

In further embodiments the switch establishes the connection by activating the respective radio transceivers.

In further embodiments the switch establishes the connection by commanding a path between the respective radio transceivers, the path including at least one repeater.

In further embodiments the switch has a radio transceiver to communicate through the respective radio transceivers of the first and the second package.

In further embodiments the switch has a first radio transceiver to communicate with the first package and a second radio transceiver to communicate with the second package and wherein the connection between the first package and the second package is through the switch.

In further embodiments the connection between the first package and the second package is through a radio reflector and wherein the switch establishes the connection by assigning a path through the reflector.

In further embodiments the reflector is connected to the system board, the reflector is connected to the system chassis, or the reflector is connected to the system housing.

In further embodiments the connection between the first package and the second package is through a third package, the third package having a first transceiver to communicate directly with the first package and a second transceiver to communicate directly with the second package and wherein the switch establishes the connection by assigning a path through the third package.

In further embodiments the third package comprises a repeater to connect the first and second transceiver of the third package.

In further embodiments the radio transceiver of the first package comprises a steerable beam to communicate with either the second package or the third package by steering the beam and wherein the switch establishes the connection by assigning a steering of the beam.

In further embodiments the steerable beam comprises a phased array antenna. In further embodiments establishing a connection comprises establishing a connection through a wired connection between the packages and the switch through the system board.

Some embodiments pertain to a method that includes receiving a request to connect from a first package having a radio transceiver at a switch, sending a request to connect from the switch to a second package having a radio transceiver, the first package, the second package, and the switch being carried by a system board, and establishing a connection by the switch through the respective radio transceivers between the first package and the second package.

In further embodiments establishing the connection comprises activating the respective radio transceivers by the switch.

In further embodiments the switch has a first radio transceiver to communicate with the first package and a second radio transceiver to communicate with the second package and wherein the connection between the first package and the second package is through the switch.

In further embodiments establishing a connection comprises establishing a connection by assigning a path through a third package, the third package being carried by the system board and having a first transceiver to communicate directly with the first package and a second transceiver to communicate directly with the second package.

In further embodiments receiving and sending comprise receiving through the system board from the first package and sending through the system board to the second package.

Some embodiments pertain to a computing device that includes a first processor package having a radio transceiver to communicate with a radio transceiver of a second processor package, the second processor package having a radio transceiver to communicate with the radio transceiver of the first processor package, a switch to communicate with the first processor package and the second processor package and to establish a connection through the respective radio transceivers between the first processor package and the second processor package, a system board to carry the first processor package, the second processor package, and the switch, and a chipset carried by the system board coupled through the system board to the first processor package and the second processor package to connect to external storage devices.

In further embodiments the connection between first processor package and the second processor package is through a radio reflector, the radio reflector being connected to a housing of the computing device and wherein the switch establishes the connection by assigning a path through the reflector.

In further embodiments the radio transceiver of the first processor package comprises a steerable beam to communicate with either the second processor package or a third package by steering the beam and wherein the switch establishes the connection by assigning a steering of the beam.

The invention claimed is:

1. An apparatus comprising:
   a first package having a first die, a plurality of first antennas, and a first radio transceiver to communicate with a second die, a plurality of second antennas, and a second radio transceiver of a second package, wherein the first radio transceiver is positioned near an outer edge of the first package and adjacent to the first die, and wherein the first die is conductively coupled to the plurality of first antennas and the first radio transceiver;
   the second package having the second radio transceiver to communicate with the first radio transceiver of the first package, wherein the second radio transceiver is positioned near an outer edge of the second package and adjacent to the second die, and wherein the second die is conductively coupled to the plurality of second antennas and the second radio transceiver;
   a switch to communicate with the first package and the second package and to establish a plurality of connections through the respective first and second radio transceivers and antennas between the first package and the second package; and
   a system board to carry the first package, the second package, and the switch.

2. The apparatus of claim 1, wherein the switch establishes the connection by activating the respective first and second radio transceivers.

3. The apparatus of claim 1, wherein the switch establishes the connection by commanding a path between the respective first and second radio transceivers, the path including at least one repeater.

4. The apparatus of claim 1, wherein the switch has a radio transceiver to communicate through the respective first and second radio transceivers of the first and the second package.

5. The apparatus of claim 1, wherein the switch has a first radio transceiver to communicate with the first package and a second radio transceiver to communicate with the second package and wherein the connection between the first package and the second package is through the switch.

6. The apparatus of claim 1, wherein the connection between the first package and the second package is through a radio reflector and wherein the switch establishes the connection by assigning a path through the reflector.

7. The apparatus of claim 6, wherein the reflector is connected to the system board, the reflector is connected to the system chassis, or the reflector is connected to the system housing.

8. The apparatus of claim 1, wherein the connection between the first package and the second package is through a third package, the third package having a first transceiver to communicate directly with the first package and a second transceiver to communicate directly with the second package and wherein the switch establishes the connection by assigning a path through the third package.

9. The apparatus of claim 8, wherein the third package comprises a repeater to connect the first and second transceiver of the third package.

10. The apparatus of claim 8, wherein the first radio transceiver of the first package comprises a steerable beam to communicate with either the second package or the third package by steering the beam and wherein the switch establishes the connection by assigning a steering of the beam.

11. The apparatus of claim 10, wherein the steerable beam comprises a phased array antenna.

12. The apparatus of claim 1, wherein establishing a connection comprises establishing a connection through a wired connection between the packages and the switch through the system board.

13. A method comprising:
receiving a request to connect from a first package at a switch, wherein the first package has a first die, a plurality of first antennas, and a first radio transceiver, wherein the first radio transceiver is positioned near an outer edge of the first package and adjacent to the first die, and wherein the first die is conductively coupled to the plurality of first antennas and the first radio transceiver;
sending a request to connect from the switch to a second package, wherein the second package has a second die, a plurality of second antennas, and a second radio transceiver, wherein the first package, the second package, and the switch are carried by a system board, wherein the second radio transceiver is positioned near an outer edge of the second package and adjacent to the second die, and wherein the second die is conductively coupled to the plurality of second antennas and the second radio transceiver; and
establishing a plurality of connections through the respective first and second radio transceivers and antennas between the first package and the second package.

14. The method of claim 13, wherein establishing the connection comprises activating the respective first and second radio transceivers by the switch.

15. The method of claim 13, wherein the switch has a first radio transceiver to communicate with the first package and a second radio transceiver to communicate with the second package and wherein the connection between the first package and the second package is through the switch.

16. The method of claim 13, wherein establishing a connection comprises establishing a connection by assigning a path through a third package, the third package being carried by the system board and having a first transceiver to communicate directly with the first package and a second transceiver to communicate directly with the second package.

17. The method of claim 13, wherein receiving and sending comprise receiving through the system board from the first package and sending through the system board to the second package.

18. A computing device comprising:
a first processor package having a first die, a plurality of first antennas, and a first radio transceiver to communicate with a second die, a plurality of second antennas, and a second radio transceiver of a second processor package, wherein the first radio transceiver is positioned near an outer edge of the first package and adjacent to the first die, and wherein the first die is conductively coupled to the plurality of first antennas and the first radio transceiver;
the second processor package having the second radio transceiver to communicate with the first radio transceiver of the first processor package, wherein the second radio transceiver is positioned near an outer edge of the second package and adjacent to the second die, and wherein the second die is conductively coupled to the plurality of second antennas and the second radio transceiver;
a switch to communicate with the first processor package and the second processor package and to establish a plurality of connections through the respective first and second radio transceivers and antennas between the first processor package and the second processor package;
a system board to carry the first processor package, the second processor package, and the switch; and
a chipset carried by the system board coupled through the system board to the first processor package and the second processor package to connect to external storage devices.

19. The computing device of claim 18, wherein the connection between first processor package and the second processor package is through a radio reflector, the radio reflector being connected to a housing of the computing device and wherein the switch establishes the connection by assigning a path through the reflector.

20. The computing device of claim 18, wherein the first radio transceiver of the first processor package comprises a steerable beam to communicate with either the second processor package or a third package by steering the beam and wherein the switch establishes the connection by assigning a steering of the beam.

* * * * *